United States Patent [19]
Blackmon et al.

[11] Patent Number: 5,154,777
[45] Date of Patent: Oct. 13, 1992

[54] ADVANCED SURVIVABLE SPACE SOLAR POWER SYSTEM

[75] Inventors: James B. Blackmon, Irvine; Kenneth W. Stone, Huntington Beach; R. Andrew Gerrick, Santa Ana; Nelson E. Jones, Huntington Beach, all of Calif.

[73] Assignee: McDonnell Douglas Corporation, Long Beach, Calif.

[21] Appl. No.: 484,874

[22] Filed: Feb. 26, 1990

[51] Int. Cl.[5] .................. H01L 31/045; H01L 31/052
[52] U.S. Cl. ..................................... 136/245; 136/246; 136/292; 244/173; 60/641.15
[58] Field of Search .............. 136/245, 246, 248, 292; 126/418, 433, 438; 244/173 R; 60/641.15

[56] References Cited
U.S. PATENT DOCUMENTS

| | | | |
|---|---|---|---|
| 4,392,007 | 7/1983 | Barkats et al. | 136/248 |
| 4,395,581 | 7/1983 | Girard | 136/246 |
| 4,784,700 | 11/1988 | Stern et al. | 136/248 |

*Primary Examiner*—Aaron Weisstuch
*Attorney, Agent, or Firm*—Gregory A. Cone; John P. Scholl

[57] ABSTRACT

A photovoltaic electric power system for use in space. A self contained sun powered electric power generating system comprising a fresnel mirror array made up of a plurality of quadrilateral mirrors individually mounted on a generally flat supporting structure with the mirrors aimed at a common point above the structure, a photovoltaic array positioned at the common point by a movable strut mechanism, heat exchanger means at the PV array to draw excess heat therefrom, coolant lines from the heat exchanger means running through the struts to transfer heat to heat pipes configured as flat panels at the edges of and perpendicular to the supporting structure, and positioning means attached to a separate structure to enable the system to track the sun. The system is designed to fold into itself in the form of an elongate box for launch, maneuvering and protection.

9 Claims, 6 Drawing Sheets

ADVANCED SURVIVABLE SPACE SOLAR POWER SYSTEM

BACKGROUND OF THE INVENTION

There is a critical need for a high efficiency, low mass, survivable space power system of the order of 5-50 KW electric, for satellites and other space based platforms. Recognizing this need, guidelines and theoretical performance objectives were developed for an Advanced Hardened Solar Space Power system.

Ideally, The system should provide 2 to 10 KW electric power to a generic spacecraft or satellite. It should be upwardly scalable to 40 KW electric for future applications. Survivability under extreme conditions, including enemy threats such as laser, nuclear or kinetic energy weapons, and natural environment extremes such as electron, proton, ultraviolet, and atomic oxygen bombardment, is an important design goal. The ideally designed device should be lightweight and readily stowed in existing or near term launch vehicles. Stowability should enable the power generator and its host satellite or spacecraft to be launched together without need for multiple launches or the need for named assembly operations or other extra vehicular activity.

As the hostile threats become more critical due to advances in the enemy weapon systems, and as the natural threats become more demanding due to selection of hazardous orbits, the need for advanced hardening concepts must be designed into flight hardware. No longer can a system be designed and later have its survivability features added, since the resulting weight penalty is too prohibitive. For all weapon systems, monitoring systems and communications, the concepts and design details which have been described above must be considered. In addition, deep space satellites are subject to the noted natural environments and require the use of the shielding concepts incorporated herein.

Most existing systems use solar cells assembled into an array and are deployed when power is required by the system. These arrays are designed to receive a "one sun" level of energy, or less if not directly aligned. Solar cells are more efficient when exposed to higher input energy. In the present invention, the 150 to 200 sun level is used. With this higher efficiency, weight savings are substantial.

SUMMARY OF THE INVENTION

The solar power system of the present invention can be utilized in space as well as in a terrestrial environment. There are many advantages to the system of the present invention over existing space power generator concepts. The use of flux reflector segments with overlapping reflected beams of solar energy can tolerate damaged facets and structure and continue operation; thus, the design is not single mode failure sensitive.

The simple construction of the rectangular folding bus configuration enables the utilization of proven components. Only two hinged joints are used on the reflector structure, which facilitates simplicity in deployment and retraction. The solar power system of the present invention can be integrated with spacecraft for launch on Shuttle Orbiter or other typical launch vehicles (Delta, Titan, Atlas, etc.).

The solar power system of the present invention can be fully retracted to completely enclose the reflector facets and the photovoltaic array to achieve unprecedented levels of survivability and high maneuverability of the spacecraft. The overall design is easily scaled to higher or lower power levels and provides the required optical performance with high stiffness. Down scaling may be the best design option for some applications.

For example, two or four modules of this design, but of smaller size, might be used to take advantage of available space on a host vehicle. The extendable pedestal connection with the main body of the satellite insures maximum angular travel for sun tracking and minimum volume for launch.

The shielded aperture shroud provides protection to the solar photovoltaic array under normal operation and also provides rapid closure of the shield to provide additional protection against threat radiation, space radiation or kinetic energy weapon projectiles during both deployment and retraction.

The reflector facets are sized and configured to provide an overlapped, uniform solar irradiance distribution on the photovoltaic cell array. A uniform distribution of irradiance on the multiple cells increases the efficiency of the cellular array.

The pattern of light incident on the photovoltaic array can be sized such that it is smaller than the overall array area. A smaller area of light incidence corresponds to decreased tracking accuracy requirements. Power is provided by the array whenever light is incident upon any of the multiplicity of photovoltaic cells present.

The multiplicity of photovoltaic cells are typically connected via blocking diodes such that in a parallel-series circuit connecting the cells, no ohmic losses are incurred by current flowing through the unilluminated or partially illuminated cells.

The design of the solar power system of the present invention enables it to be far less sensitive to damage than high concentration ratio systems where a load of 1500 suns or higher on receiver surfaces and 10,000 suns at the aperture is the norm. Damage to one or more of the reflector facets could cause sunlight to be reflected off of the photovoltaic array. This condition would only cause minor amounts of heating of exposed surfaces since the facets are flat and do not concentrate the reflected sunlight.

However, a concentrating facet design, usually required with solar dynamic power systems, usually has too high a concentration ratio, ranging up to several hundred suns, such that the misalignment of one facet can cause damage to areas not intended for exposure. If one or more of the reflector facets are damaged and therefore reflect light into peripheral areas of the photovoltaic array, the converted electrical energy can be utilized, although the conversion occurs at a somewhat lower efficiency, due to the blocking diode design of the photovoltaic array cellular connection circuit.

A low concentration ratio allows lighter structure to be used because the allowable angular deviations from 100% alignment due to this design are greater. With high concentration ratio systems, high tracking accuracy and aimpoint requirements must be met, requiring stiff heavier structures and drive systems.

The present design also safeguards adjacent structures by minimizing off-axis aberration flux on normally nonirradiated portions of the power system or satellite/spacecraft.

Acceptable power conversion systems for utilization with the space solar power system of the present invention include photovoltaic cells, turbine cycles such as Rankine or Brayton, and any other system such as direct chemical conversion, etc. Based upon our findings efforts, the photovoltaic cell option is considered optimum because this system better lends itself to lightweight survivability shielding, imposes no dynamic loads on the platform, and takes advantage of the major advances which have been recently made in this technology.

BRIEF DESCRIPTION OF THE DRAWINGS

The structure and method of operation of the invention, together with additional advantages thereof, will be best understood from the following description of specific embodiments when read in connection with the accompanying drawings, in which.

DETAILED DESCRIPTION OF THE PREFERRED EMBODIMENT

Figure 1A:
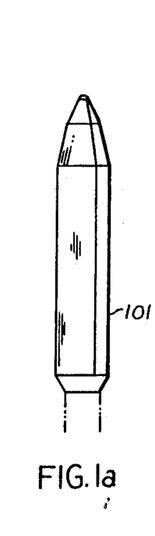
FIGS. 1a through 1h illustrate the progressive stages of deployment of the solar power system of the present invention.
Figure 1B:
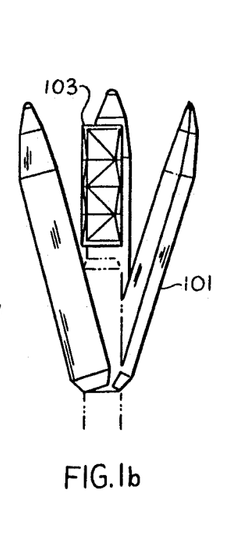

Referring to FIGS. 1a-1h, a deployment series for the reflector of the present invention is illustrated. Since the available launch platforms such as Shuttle, Titan, Delta, etc., best accommodate a cylindrical payload, the advanced survivable space solar power system of the present invention stows within such an envelope and provides maximum utility for what will specifically be required in an unknown payload configuration. FIG. 1a illustrates a Delta rocket 101, or the like, having a compact cylindrical space within which to carry a payload. In FIG. 1b, the one third each sections of the shells of the rocket 101 fall away, exposing the structure of the solar power system 103 of the present invention.

Figure 1C:
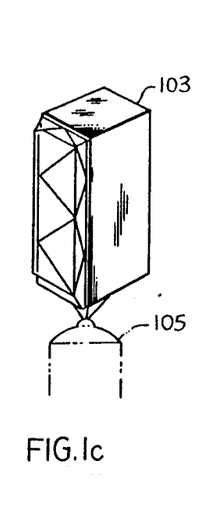

In FIG. 1c, a more detailed view of the solar power system 103 illustrates its attachment to satellite housing 105. Typically, satellite housing 105 will contain electronics for communication, or some other device to be operated upon the power transducted by solar power system 103. FIG. 1c illustrates the condition of solar power system 103 in its folded condition, immediately before deployment.

Figure 1D:
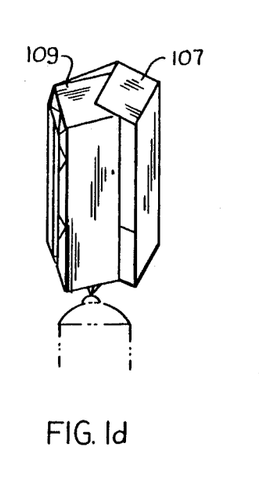
Figure 1E:
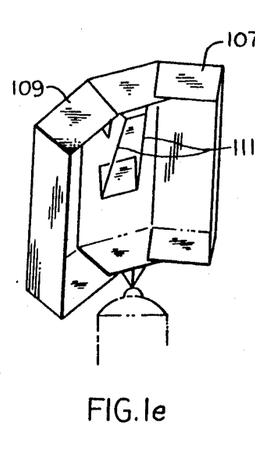
Figure 1F:
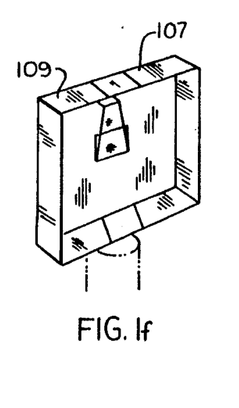
Figure 1G:
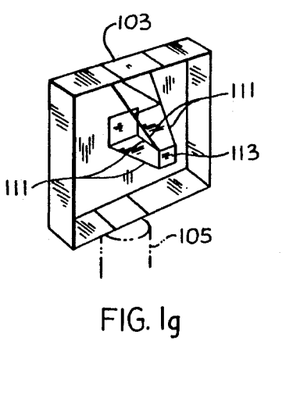
Figure 1H:
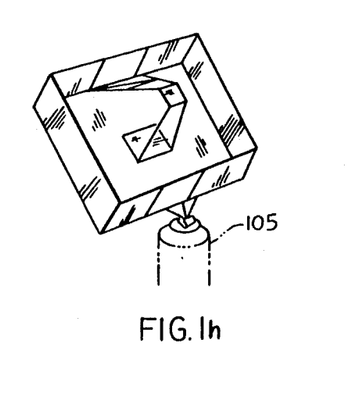

In FIG. 1d, the earliest stage of deployment is illustrated. Folding edges 107 and 109 begin opening outwardly. FIG 1e illustrates a further opening of edges 107 and 109, as they open to expose a pair of collector struts 111. FIG 1f illustrates the folding edges 107 and 109 in fully extended position. FIG. 1g illustrates the deployment of struts 111 and shroud 113. Finally, FIG 1h illustrates the tiltability of the solar power system 103 with respect to satellite housing 105 to facilitate optimum positioning for maximum heat flux input.

The rectangular folding box configuration of solar power system 103 enables the use of simple, dependable, and lightweight deployment mechanisms, totally remote deployment operation, and the ability to restow is rapid, as for example in the case of a hostile threat.

The shroud 113 neatly stows within the folding box shaped solar power system 103 of the present invention for launch or for protection from major threats. To enable this stowing sequence, a folding strut design is used. The unique joint design is employed to allow power, control and sense lines as well as fluid lines to be continuously protected. The "knee" joints employed for use with struts 111 (not shown) allow 180 degree flexing with all lines embedded within the struts 111 for full protection.

Figure 2A:
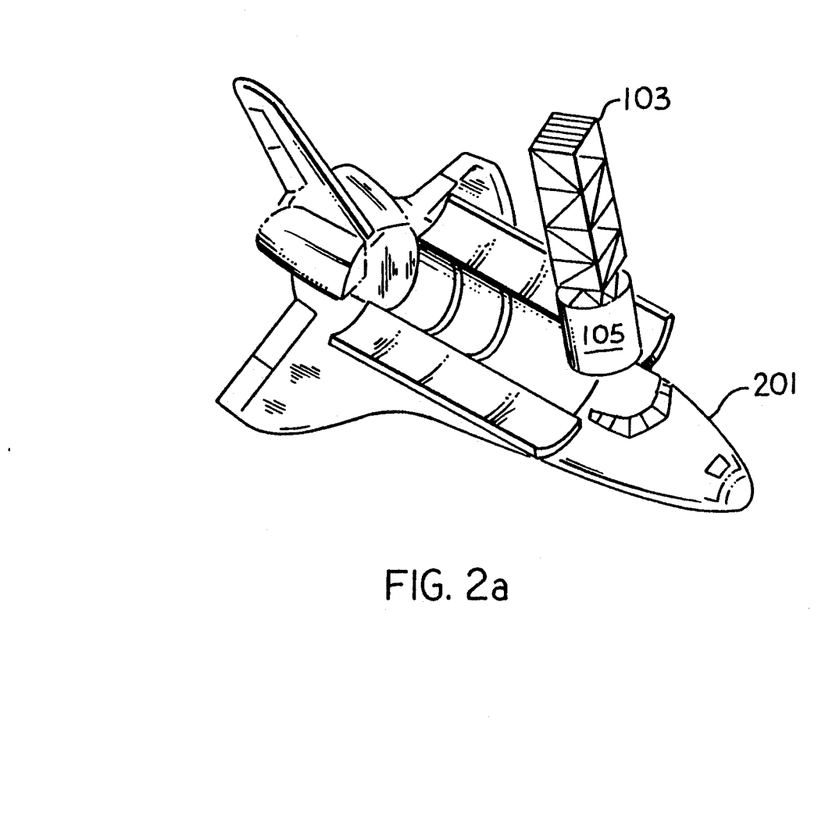
FIGS. 2a and 2b illustrate the beginning and conclusion; of deployment, from the space shuttle, of a satellite utilizing the solar power system of the present invention, and which would progress through the same intermediate steps of deployment illustrated in FIGS. 1c-1h.
Figure 2B:
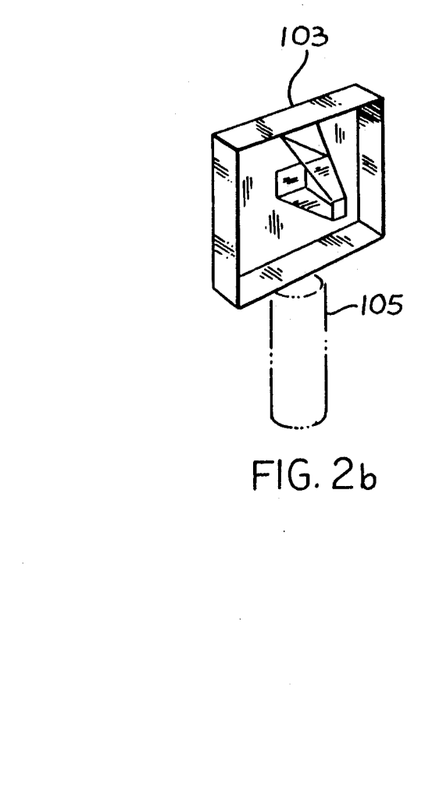

FIGS. 2a and 2b illustrate the beginning and conclusion of deployment, from the space shuttle 201. In this case, the generally cylindrical solar power system 103 is carried in the shuttle bay, erected perpendicular with respect to the shuttle, and launched. Subsequent deployment would progress through the same intermediate steps of deployment illustrated in FIGS. 1c-1h, concluding as shown in FIG. 2b.

Figure 3:
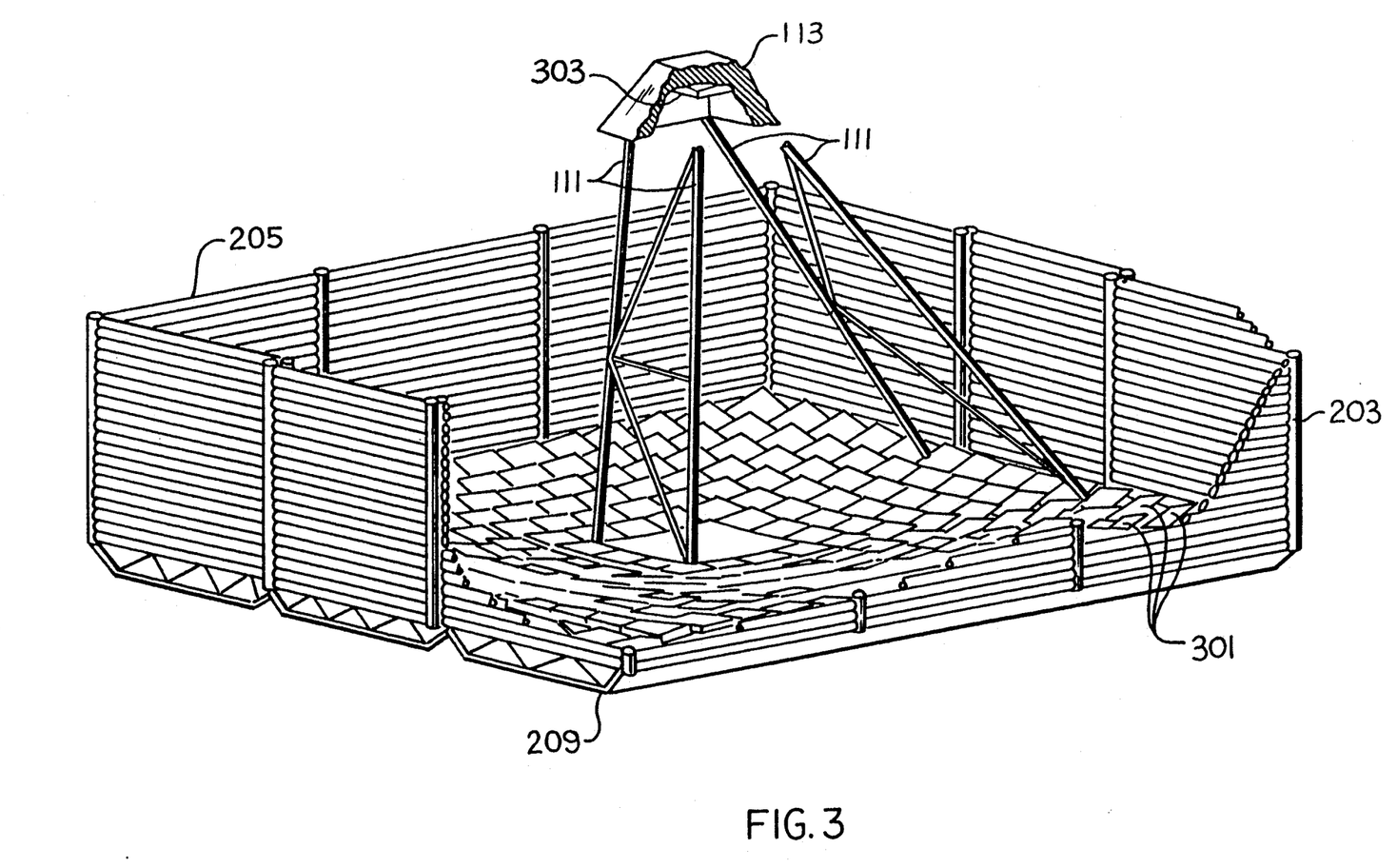
FIG. 3 illustrates a perspective, somewhat cutaway view of the solar power system of the present invention shown being deployed in FIGS. 1 and 2.

FIG. 3 illustrates a perspective, somewhat cutaway view of the solar power system of the present invention shown being deployed in the series of FIGS. 1 and 2. Because the natural and hostile threats are considered of maximum importance to the design of this system, several areas are shielded to allow survival for what is estimated to be a minimum of 10 years.

The basic folding box configuration of FIGS. 1-3, using a Fresnel mirror arrangement 301 is extremely simple, and solves several design problems. The advantages of a parabolic mirror profile, with the associated complex actuation and hinge line problems, is combined into a compact, square prism shape which uses a simple two hinge line approach as is illustrated in FIGS. 1a-1h, to offer an extremely volume-efficient solution to launch constraints.

A series of mirrors, or mirror array 301 is positioned to direct light energy at a photovoltaic array 303. The "heart" of the system is a photovoltaic cell array 303. Because the photovoltaic cell array 303 application uses a lower flux concentration than other power generating systems, misalignment is less critical because the flux concentration is low enough to do little if any damage to surrounding structure.

High concentrations, such as found on solar dynamic systems, will burn through structures that are not elaborately protected from the extreme temperatures generated. For these reasons, minor aberrations due to damaged mirrors or substructure may lower the system output slightly but will not cause catastrophic structural damage or require heavy protection.

The lower concentration ratio flux requires lower tracking accuracy to maintain efficient operation. The accuracy requirements are reduced by roughly the ratios of concentration required; for this system, the accuracy is reduced by about a factor of 10, over a high concentration flux system. Since the pointing for each mirror is less critical for this approach, a lighter structure facilitating less costs associated with design, fabrication, and materials as well as lower launch costs.

In addition, the space solar power system 103 of the present invention is able to point to all angles during its orbit to shield the photovoltaic array 303 from threats from all directions.

Shroud 113, which encompasses photovoltaic, cell array 303, is shown atop struts 111. At the base of the struts are a series of generally rectangular mirrors 301 which will be dealt with in more detail in a subsequent FIG. Each of the mirrors is oriented to direct solar energy in the direction of shroud 113.

The system is designed so that the solar power system 103, shroud 113 and struts 111 can be readily retracted and the array of mirrors 301 folded for added protection in the event of a high threat encounter or to facilitate maneuvering. The struts 111 are designed to prevent damage from enemy threats. This is accomplished by the use of low Z shielding and redundant flow paths for movement of the heat transfer fluids.

To protect from a nuclear threat, radiation may be reflected, absorbed, or allowed to pass through the subject structures, the solar power system 103, shroud 113 and struts 111, as appropriate. Those structural elements and therefore the materials from which they will be made which have low atomic numbers are little effected by nuclear (x-ray) doses.

These materials, also known as "low Z" materials, are made from lithium, beryllium, boron or carbon, for example. They act as "windows" where a minimum of energy is absorbed, and are therefore are not subject to thermal spallation, blow off impulse, thermal impulse, sublimation, or explosive destruction.

This reactability to enemy threats is performed with a robustness achieved in several ways. First, all of the utilitarian structure of solar power system 103 is contained within the struts. Each line is paralleled with another which runs through a second strut—thus creating a redundant system so that the loss of one strut does not make any system inoperative. The use of four struts provides for support of the shroud 113 if one strut is severed—erection/deployment would, however, be prevented.

In order to hinge the struts, each of the interior lines and/or conductors must exit from the strut termination or central hinge through a swivel joint. In addition, a unique joint has been developed for this system so that a large radius bend can be constructed where the lines and/or conductors are fed entirely through the center of the strut. The design is stiff in one plane while a stiffening tube over the hinge components adds stiffness in a second plane. The struts are also protected by a simplified bumper/catcher shield over the joints similar to that described in J below.

About the rectangularly shaped solar power system 103 are a series of posts 203 connecting a series of heat pipe walls 205. Posts 203 act as heat energy exchange points for the two fluids carrying heat energy. Heat pipe walls 205 dissipate heat energy to the surroundings from both sides thereof. Support structure 209 supports the structures of the solar power system 103 and lends stability and rigidity to the design.

The placement of heat pipe posts 203 and radiator walls 205 around the periphery is a unique solution to the problem of aligning the radiator panels normal to the sun direction. This design gives the radiator wall panels 205 greater structural strength, higher reliability by elimination of folding heat pipes or heat pipes with joints, and allows higher maneuvering acceleration due to the additional structural integrity.

This design has an advantage over other systems in that it eliminates the use of gimballed joints and associated control systems to keep the proper orientation. This placement also adds better protection for the shroud 113 by elimination any direct "line-of-sight" into the area of the photovoltaic array.

Each of the mirrors 301 is angled to direct what will essentially be plane waves of light to the shroud area 113 which will contains the photovoltaic cell array 303. Light energy utilizable to power the photovoltaic cells will create unwanted heat. The unwanted heat is transferred to a cooling fluid within the shroud 113. The cooling fluid flows down the struts 111 on its way to posts 203. Within posts 203, the fluid gives up heat energy and returns to the shroud 111 area by a return path on struts 111 to absorb more heat energy.

An alternate approach uses two fluid systems where the posts 203 radiate some energy, but the bulk of the energy is transferred into a second fluid, physically separated from the fluid flowing between the struts 111 and posts 203. This second fluid is a heat pipe fluid which is wicked into the heat pipes within the heat pipe walls 205.

Figure 4:
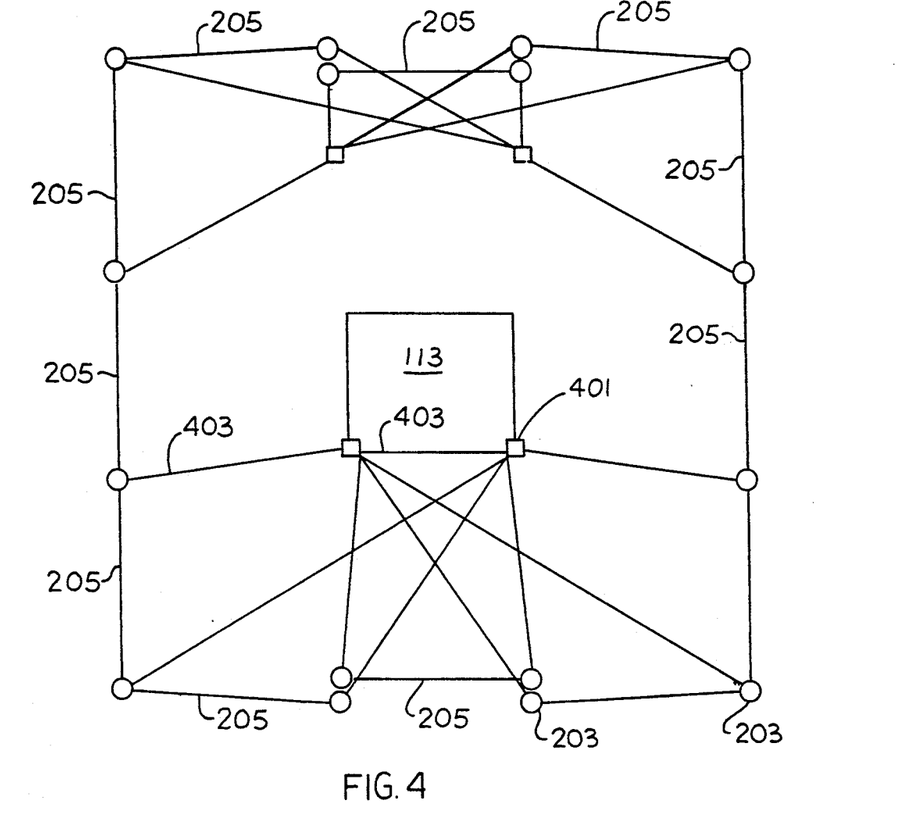
FIG. 4 illustrates a schematic diagram of the redundant fluid loops of the solar power system of FIG. 3.

Radiator system redundancy is critical. Referring to FIG. 4, a schematic diagram of the redundant fluid loops of the solar power system 103 illustrates fluid flow paths generally coplanar with respect to the area of mirrors 301 illustrated in FIG. 3. In FIG. 3, the shorter two of the four struts 111 extend nearly straight downwardly from shroud 113 to near the center of the mirror array while the two longer of the struts 111 extend more angularly from the shroud toward the lower edge of one of the heat pipe walls 205.

The solar power system of the present invention incorporates a redundant, fluid loop schematic design and a redundant radiator concept. FIG. 4 shows a redundant, fluid line schematic as distributed from the shroud 113 area to the radiator panels. The destruction of a line does not result in radiator area loss for two reasons. In principle, the line that is leaking is closed off by flow valves (not shown) and the fluid flows through the remaining lines. The heat transfer from the header or post 203 to the heat pipe fluid would be decreased, the overall pump efficiency decreases, and the overall pump power increased to offset the higher flow resistance. However, there would be at least a partial compensation for the loss in flow rate and the total waste heat radiating area would remain the same.

In FIG. 4, the posts 203, as were seen in FIG. 3, are represented by a series of circles. Heat pipe walls 205 are represented by a series of straight lines connecting the posts about the periphery of FIG. 4. Small square FIGS. 401, to which all posts 203 are connected, represent the attachment point for struts 111 of FIG. 3.

A series of flow conduits 403 connect each attachment point 401 to four posts 203. None of the posts 203 are connected via flow conduits 203, to more than one attachment point 401. Flow can occur, in the flow conduits 403 in either direction along its length. Nearer the center of the structure of FIG. 4, a flow conduit 403 joins two attachment points 401. The darkened three sided rectangular shape in the center of FIG. 4 represents the area over which the shroud 113 is located.

By mounting the heat pipe walls around the periphery of the mirror 301 array as shown in FIG. 3, at least three important advantages occur. First, the radiators form a natural kinetic energy weapon, laser and x-ray shield for a portion of the lower hemisphere of the advanced solar power system of the present invention. Secondly, during any period that the solar power system is in operation, the heat pipe walls 205, which act as heat radiators, are positioned parallel to the sun's path so that they point to space, or only occasionally at the earth, rather than to the sun. This maximizes the re-radiation of waste heat to space. And, thirdly, this placement leads to convenient fluid line routing, line redundancy, and shielding.

The radiator array is constructed of a header which contains the coolant ducting paths, and supports each heat pipe segment. See FIG. 3. The design of these heat pipes is unique in that they are double ended so that "hot" evaporator zones are located at the headers at both ends—with the "cold" condensing zone located in the center. This concept provides built-in redundancy because if one header is damaged or otherwise inoperative, the heat pipes in that loop will still be active via input from the opposite end and essentially the entire length of heat pipe will remain effective.

Figure 5A:
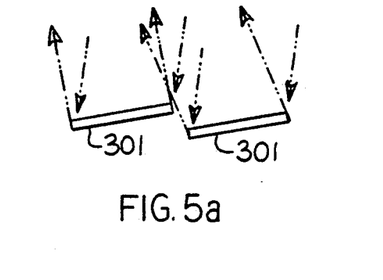
FIGS. 5a and 5b illustrate a side view of the Fresnel orientation of the panels of the solar power system of FIG. 3.
Figure 5B:
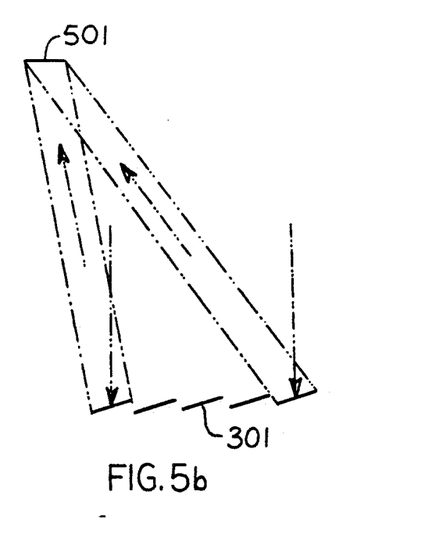

Referring to FIGS. 5a and 5b, an illustration of the Fresnel orientation of the reflecting panels of the solar power system of the present invention emphasizes the differentially greater tilt of adjacent mirrors. In FIG. 5a, parallel rays strike two adjacent mirrors 301 having differing degrees of tilt, causing the resulting reflected rays to propagate upwardly to the left at a converging angle. FIG. 5b illustrates five adjacently placed mirrors 301 with the two mirrors 301 at the extreme ends of the multiple adjacency, for clarity, directing light rays upon a focal plane 501. Focal plane 501 is where the photovoltaic arrays will be located, in the case of power generation, or where the heating target would be located in the case of a Rankine cycle power plant. Individual mirrors are not moved relative to each other, but rather fixed such that the structure of FIG. 3 would be moved to optimum position with respect to the source of solar energy.

The present design enables the use of an active alignment system to minimize mirror array 301 deformation, and therefore the spilling of energy onto surrounding structure, due to thermal or residual stresses in the support structure. With systems employing the parabolic concentrator approach, the folding sequence and associated mechanisms are very complicated and the positioning is critical. The novel design of the present invention incorporates a Fresnel mounting of the flat mirrors 301 such that the resulting array structures are planar, with each mirror 301 facet mounted at a fixed angle upon the structure.

Especially in the case of a photovoltaic power generator, the flux distribution upon focal plane 501 should be essentially constant across all cells, to yield an equal energy concentration on every cell entity within the photovoltaic cell array. A square cell array has a square layout and thus the use of square mirrors 301 for accurately intercepting a square projection of the incoming solar flux increases the efficiency of the collector.

Also, since the reflected energy leaves each mirror 301 at an angle as is shown in FIG. 5b, a space is located between each mirror, to prevent interference and shadowing by each adjacent mirror. It should be noted that most mirrors are tilted with respect to the two axes with respect to the support structure.

For simplicity, FIG. 5a and 5b shows the condition along the x or y axis of the array where mirrors 301 are tilted at a simple angle. In reality, each mirror is tilted at a compound angle. Further, the use of many independent facets enhances survivability during a kinetic energy weapon attack. For any single impact, the flux from only one, or possibly only a portion of one mirror 301 will be lost.

For space deployment, the design of the present invention lends itself to facilitating the adjustments necessary for gravity environment assembly and low gravity operation. The system will be assembled and aligned in full gravity, experience acceleration during launch, and experience thermal stresses in the supporting structure after deployment, especially upon leaving the eclipse portion of the orbit. While in orbit, the system will experience micro gravity conditions which will produce relaxation of the structural deformation present during assembly in the normal gravity environment. In addition, higher stresses, based upon maneuvering, attitude control, and orbital transfer, may occur during operation. Thermal deformation and damage from hostile threats will also contribute to alignment error.

For these reasons, an active alignment system may be required. The photovoltaic array system embodied within the present invention is tolerant of misalignment. To combat total misalignment, a two active alignment element system is proposed. One element is based upon the laser/multiple detector system, while the second is a Digital Image Radiometer system modified to align mirrors and observe the photovoltaic array.

The solar power system of the present invention was designed to have maximum orientability with respect to the spacecraft or satellite which will benefit from our power generation. The orientation can be at any angle with respect to the sun direction including, the horizon, earth scanning, celestial pointing, above and below threat scanning, or even sun pointing. The satellite mass and moment can be varied, and the tracking system will take the masses of the solar power system 103 to account.

It should also be noted that purposely slewing from perfect sun alignment is an option which may be used to reduce power generation during extended periods of inactivity to minimize power overload to any storage system which may be present. Also, slewing may be utilized to avoid threat effects. For these reasons, the design must allow the concentrator to view a wide range of spherical angles. The approach chosen for this design is to mount the solar power system 103 to provide maximum movement with respect to the satellite housing 105 as is shown in FIG. 1h. The tracking system should ideally provide high torque, dependable movement with minimum backlash, and be power efficient.

Figure 6:
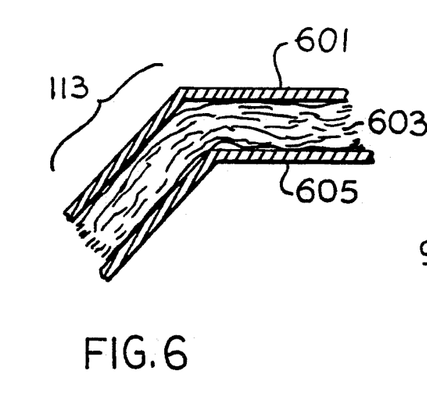
FIG. 6 is a simplified cross sectional view of the fabric attenuator sandwich design of the structure of a portion of the solar power system of FIG. 3.

Referring to FIG. 6, a sectional view of the shroud 113 of FIG. 3 is illustrated, emphasizing the "bumper/catcher" structure thereof. The outer "bumper" layer 601 surrounds a series of woven layers 603. Woven layers 603, in turn, surround a "catcher" layer 605. The shroud 113 structure with integral woven layers 603 will completely cover the upper hemisphere and partly down the sides of the shroud 113, to form shielding for the photovoltaic cell array 303. This shielding can be made of beryllium to reduce infrared laser absorption, as well as of other low Z materials arranged to attenuate nuclear x-rays.

The "bumper/catcher" approach has been developed to guard against kinetic energy weapon threats over a given projectile weight/velocity range. As the projectile impacts the outer bumper layer 601, the initial energy is partially absorbed by fracture of both the projectile and the bumper layer 601. As the debris from this impact continues inward, the energy is further absorbed by woven layer 603 which acts as a momentum attenuator in a manner similar to a "flack vest". The rear catcher layer 605 is used to contain the debris to prevent damage to the interior components and to prevent contamination of sensitive components.

This shield approach would be used to protect the upper hemisphere of the photovoltaic array 303. It could also be used to protect other locations. The shield design incorporates features to protect against kinetic energy weapon, nuclear x-ray, and laser threats.

The lower hemisphere of shroud 113, of FIG. 3 is protected from threat by the peripheral radiator "fence" of posts 203 and connecting heat pipe walls 205, as well as portions of the support structure 209. Since the radiator heat pipe walls 205 are formed from beryllium and/or carbon-carbon members, kinetic energy particle intercepts will probably shatter kinetic energy pellets of low atomic number, and not shatter kinetic energy pellets of high atomic number. In either case, due to the long distance between an impact area on the lower portion of the structural portion of the solar power system 103 and away from the photovoltaic array 303, there is a low probability of impacting the smaller area of the photovoltaic array 303.

Laser heating upon the outside layer 601 of shroud 113 of FIG. 6 is not a threat to the photovoltaic array 303, since all points of direct entry of laser heat are structurally prevented from being in a direct line of sight by the upper shroud 113, the support structure 209, or by the "fence" of posts 203 and connecting heat pipe walls 205. In the extremely unlikely event that a laser is directly within the line of sight to the sun, to within a few milliradians, will laser energy be directed back to the photovoltaic array 303. This unlikely case is easily handled by a slight change in angle of the solar power system 103.

Nuclear penetration may be prevented by a woven drape over the back of the support structure 209. Such a drape would have a fiber composition which shields from x-rays without thermal impulse problems. The same woven drape can be used to cover the inner surface of the radiator array and the inner surface of the upper shroud.

Efficiency of the photovoltaic array 303 may be reduced over extended periods by impingement of low energy electrons reaching the photovoltaic cell array 303 by spiraling along the Earth's magnetic field lines. This influence is slight and damage can be minimized by a transparent coating of a protective material, such as silicon dioxide over each cell within photovoltaic array 303. Atomic oxygen impingement is a negligible problem because the oxygen atoms are in free molecular flow and are blocked by the shield concentration and radiators.

The same is true for high energy electrons which will be approaching in a spiral manner along geomagnetic lines of force, but with radii of curvature of the order of kilometers. In this case, the electrons have essentially straight paths and, as in the case of a laser beam, cannot directly impact the photovoltaic array 303. In each of the above cases, the statistical probability of impact is finite, but small, and therefore deemed to cause minimum degradation.

An additional shield may be closed over the photovoltaic array aperture should a dense kinetic energy weapon, laser or nuclear threat be anticipated. This shield can be constructed in the same manner as the bumper layer 601/catcher layer 605 and integral momentum attenuators of woven material 603, described in FIG. 6. The shield for the shroud 113 may also provide a Faraday cage to minimize electric fields acting on the photovoltaic array, for example, from the plasma induced electric fields on the spacecraft.

Figure 7:
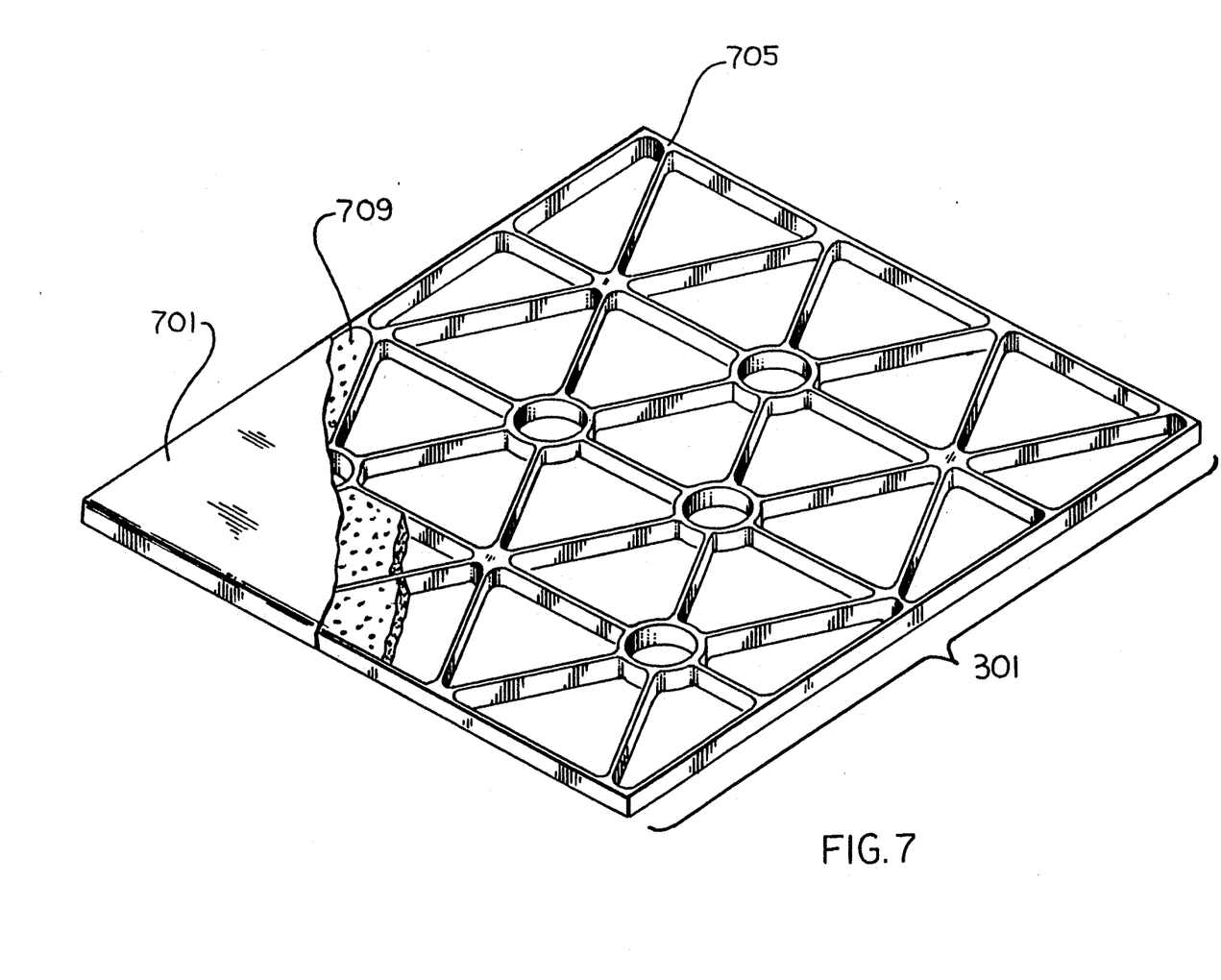
FIG. 7 illustrates a perspective view of the structural details of the reverse side of the mirrors/reflective panels of the solar power system of FIG. 3.

Referring to FIG. 7, an illustration of one of the mirrors 301 of the mirror array 301 reveals its structure. A layer of reflective foil 701 is supported by a structure 705 which lends rigidity to reflective foil 701. In between the structural members of structure 705 are sectional layers of optional lithium metal filler 709.

In conventional optics, such high quality components, as would normally be utilized for the mirrors of mirror array 301, are difficult and costly to produce. Since the solar power system of the present invention can accept a lower surface quality, the use of flat mirrors greatly reduces the mirror complexity with resulting cost advantages.

The mirror 301 of FIG. 7 proposed for the solar power system of the present invention is a typically flat, rectangular shape in order to intercept a square projection of the incoming solar flux, and made of lightweight components. Alternate shapes can be used. For example, with a square photovoltaic cell array, requiring a square incident flux profile, mirrors at the diagonal corners could be trapezoidal to better provide a square flux profile. These details would be dictated based upon permissible variations in the design process. In certain designs, all of the mirrors could be square and the same size or some combination of different shapes and sizes could be used.

The structure 705 of FIG. 7 is ideally constructed of a low Z carbon-carbon, iso-grid or other supportive structure such as a beryllium honeycomb, or other materials with a strength enhancing shape as required. As is shown in FIG. 7, structure 705 is covered with a reflective surface of beryllium foil 701, again ideally constructed of a low Z material.

The reflective foil 701 is stretched over the structure 705 during the manufacturing process, possibly at an elevated temperature, so that the foil 701 will remain in tension and, therefore stretched flat, at the expected operating temperature. Exposure to laser flux, as from a laser weapon, could cause deformation of foil 701 which would temporarily disturb the optical qualities of the mirror 301. As the energy is re-radiated from mirror 301, however, the foil 701 returns to its stretched, flat condition. A beryllium foil 701 may also be used to cover the back surface to protect the carbon-carbon due to erosion from impact of atomic oxygen. The interior of each facet is designed to accommodate an optional lithium metal filler 709. Lithium, a low Z material, will act as a "thermal capacitor", since it is in intimate contact with the metallic surfaces. The lithium filler 709 will absorb energy deposited on the mirrors by a laser threat, store this energy by a change of phase from solid to liquid, and then gradually re-radiate from the front and back of the mirror 301. The cooling cycle returns the lithium back to the solid state for the next threat. The concept of using a lithium insert as a "thermal capacitor" is novel and simple, yet it provides a far greater degree of protection from all three threats, especially ground based laser.

The use of a foil 701 over-wrap on carbon-carbon components, instead of standard optical materials, prevents direct impingement of atomic oxygen on the carbon-carbon. From data that has been reviewed, the material need only be protected from direct impact. Therefore the covering does not have to be gas-tight, and a foil 701 wrap is sufficient. Over flexible joints, a flexible beryllium boot will be fitted.

Beryllium foil 701 can be fabricated in tape form to enable wrapping of components which need to be protected from atomic oxygen. The tape of the foil 701 can be wrapped in an overlapping manner. The wraps can be secured by use of fine beryllium wire, since adhesives would not withstand heat or nuclear attack. The wraps do not need to be tight, since the intent is to prevent direct impingement of the oxygen particles.

The use of flat panel mirrors 301 is unusual for concentrator designs. These are used in our design to achieve a low cost mirror while providing a "flat" flux distribution for maximum efficiency of the photovoltaic array 303. Further, the facet design survives laser and x-ray threats far better than curved designs, and is far less subject to thermal distortion.

High energy laser mirrors are sometimes fabricated from copper or beryllium plate stock or castings, which can have increased weight. The stretched beryllium foil 701 greatly reduces weight and fabrication costs. High elongation cross-rolled beryllium is readily available and easily handled with a minimum of fabrication effort. Simple fasteners can be used. This approach simplifies the degree of process control required for fabrication to provide the necessary protection from breathing fine beryllium dust.

Figure 8:
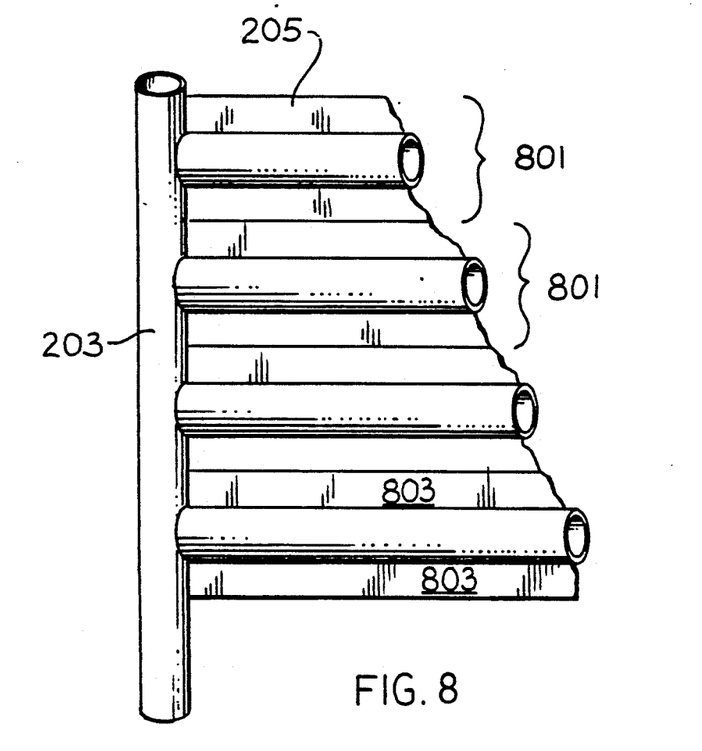
FIG. 8 illustrates a perspective sectional view of the wicked heat pipe design incorporated into the solar power system of the present invention of FIG. 3; and, FIG. 9 illustrates the heat pipe of FIG. 8 incorporated into a heat pipe wall.
Figure 9:
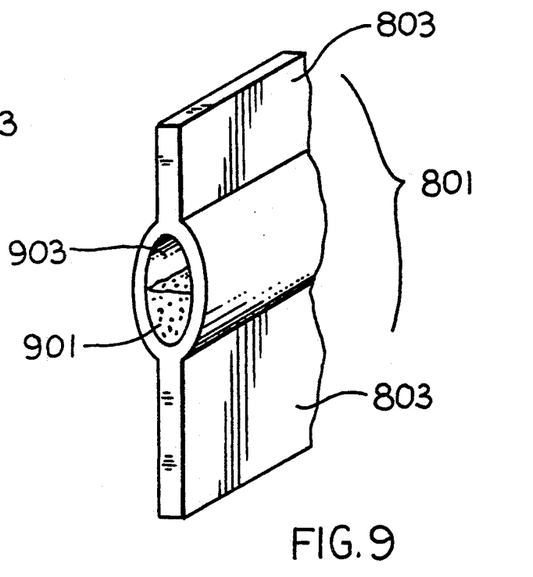

Referring to FIG. 8, shown is a closeup view detailing the posts 203 connecting a heat pipe wall 205. The heat pipe wall 205 can be seen to be made up of a number of individual heat pipes 801, each joined to the other by one of its fins 803. Referring to FIG. 9, a closeup detail of an individual heat pipe 801 is illustrated.

The dual header design incorporated herein has heat pipes 801 with evaporator section 901 and condenser section 903 throughout the pipe 801. Evaporator section 901 is a wick-like structure which pulls the cooling fluid along in an osmotic fashion. Under normal operation, the condensing sections would operate as approximately equal length. The loss of a post 203 would still allow the entire length of the heat pipe 801 to be used under operation of the post 203 at its other end. The "double ended" design of the heat pipes 801 is a novel approach for solving the reliability problem in that the loss of one header does not cause a commensurate loss in radiating area, and essentially full effectiveness is retained.

Generally, with reference to all of the FIGS. and the design of the solar power system of the present invention, several factors in the overall structure lend important advantages. Mirror alignment tolerances are not critical. The mirrors 301 can withstand launch and maneuver motion. Heat pipes 801 are mounted on the periphery of the solar power system 103. Heat pipes 801 are not folded or bent for stow. Only high reliability, low pressure fluid couplings, such as struts 111, and/or flex lines are required for heat transfer fluid. Heat pipe walls 205 provide additional protection for shroud 113. The radiating surfaces of heat pipe walls 205 are parallel to the sun's rays and radiate from both sides, thus optimizing waste heat rejection. Heat pipes 801 are of a unique double ended design for damage tolerance. The mounting of the solar power system 103 upon the satellite housing 105 provides high torque, rapid slew capability, high stiffness and zero backlash.

The generally flattened mirrors 301 provide an essentially flat flux profile on photovoltaic cell array 303 to maximize efficiency. Mirrors 301 provide high tolerance to high temperature effects, especially when compared to curved facet designs required for high concentration ratios. Optical surface requirements for foil 701 are very liberal, and easily achieved. Mirrors 301 are fabricated from low Z materials for nuclear survivability. The mirrors 301 employ an optional, unique "thermal capacitor" of lithium to store and re-radiate energy from laser threats.

The "bumper/catcher" shield design upon shroud 113 lends protection against photovoltaic cell array 303 degradation from high energy Van Allen Belt radiation when spacecraft must operate in this extremely harsh environment. Van Allen Belt radiation is a source of protons having an energy ranging from approximately 100 to 400 MeV.

Kinetic energy weapon and "space junk" debris projectiles would pass through a mirror 301 with minimal effect on total flux or flux profile, at photovoltaic cell array 303. The use of a beryllium reflector as a mirror 301 with optional high reflectivity aluminum coating would survive high laser and nuclear threat levels.

The high reflectivity achievable, usually about 94%, with the thin aluminum film coating provides a specific power increase of the order of 40% but with an order of magnitude reduction for nuclear threat levels. The very thin, on the order of a few angstroms thick, overlayer of aluminum will increase the reflectivity of the mirror 301 for greater system efficiency.

This very thin layer of aluminum, although aluminum is a medium z material, will not cause a major problem when exposed to an infrared threat. In a worst case scenario, a severe, high flux infrared, nuclear, or X-ray exposure could evaporate the aluminum coating from the surface of mirror 301, leaving the beryllium undersurface intact to reflect at its lower, but acceptable level. This effect can be minimized by optimizing coating thickness.

The support structure 705 of FIG. 7 can be made of survivable, lightweight, high strength, high stiffness, high temperature resistant carbon composite to maximize survivability and minimize system mass. Optionally, a graphite-epoxy, graphite-glass, or graphite-aluminum composition may be used. Alternately, beryllium support structures are candidates for support structure 705.

The use of beryllium foil 701 protection on carbon composite support structure 705 prevents atomic oxygen degration of carbon composite, increases the likelihood of survival in the event of nuclear bombardment, reflects infrared laser energy at greater than 95%, and is capable of sustained, high temperature exposure. Beryllium foil 701 is in poor thermal contact with carbon composite support structure 705 in order to minimize temperature rise in structure. High thermal conductivity of carbon composite support structure 705 and beryllium foil 701 minimizes peak temperature under laser attack in exposed areas.

The configuration of the solar power system of the present invention is a flat square concentrator with a simple 2-fold deployment scheme. For power levels less than approximately 20 kW, with beryllium reflectors, and approximately 35 kW with aluminum reflectors, this configuration can be stowed in existing launch vehicles as shown in FIGS. 1a–1h and 2a and 2b, and once in orbit, it can be easily deployed. The mounting of the heat pipe walls 205 around the edges of the concentrator simplifies stowage for launch, minimizes solar heating, and enhances maneuverability.

The foregoing disclosure and description of the invention are illustrative and explanatory thereof, and various changes in the configuration, thermal and electrical elements, as well as the details of the illustrated configuration may be made without departing from the spirit and scope of the invention.

I claim:

1. A solar power system, comprising:
   generally planar support means for providing support to said solar power system;
   heat pipe wall means, located along the outer edges of said support means and perpendicular with respect to said support means, for radiating waste heat away from said solar power system;
   foldable strut means, having channels adapted to receive a heat transfer fluid and having one end pivotally attached to said support means and an other end, for providing support and for providing a fluid conduit;
   transducer means, having a front side and a back side connected to said other end of and in fluid contact with said strut means, for receiving concentrated light energy on said front side and converting said light energy into electrical energy, and for rejecting waste heat into fluid circulating within said strut means;
   mirror means, mounted about the surface of said planar support means, for directing light energy approaching normal to said planar support means toward said transducer means; and,
   heat exchange means, located along the outer edges of said support means interstitially with respect to said heat pipe wall means and in fluid contact with said heat pipe wall means and said strut means, for transferring heat from fluid received from said strut means into said fluid from said heat pipe wall means and for keeping said fluid received from and returned to said strut means segregated from said fluid received from and returned to said heat pipe wall means.

2. The solar power system of claim 1 wherein said mirror means further comprise a plurality of fresnel oriented mirrors, each oriented to reflect solar light energy.

3. The solar power system of claim 1 including a protective shroud surrounding said transducer means and wherein said shroud further comprises:

an outwardly disposed bumper layer covering said back side and extending partly beyond said front side of said transducer means;
   a plurality of woven layers, inwardly disposed with respect to said bumper surface and layered adjacent to the inwardly disposed surface of said bumper surface;
   an inwardly disposed catcher layer, adjacent to said plurality of said woven layers and, with said bumper layer, sandwiching said plurality of said woven layers, said bumper layer connected to said catcher layers along their outer periphery.

4. The system of claim 1 wherein the heat exchange means located interstitially with respect to said heat pipe wall means further comprise a plurality of post heat exchangers located at the edges of the support means, extending normal thereto and located within the heat pipe wall means whereby transfer to heat occurs across the walls of the post heat exchangers to the adjacent heat pipes in the heat pipe wall means.

5. The system of claim 4 wherein the heat pipe wall means comprise a series of individual heat pipes oriented generally parallel to the base of the wall means spaced apart form one another by diametrically opposed heat fins such that the fins fall within the plane of the wall with each end of an individual heat pipe abutting a post heat exchanger.

6. The power system of claim 1 further comprising positioning means attached to the support means and attached to another object such that the power system may be oriented towards the sun relative to the object.

7. The power system of claim 1 wherein the support means comprises a left subsection, a middle subsection and a right subsection such that the left subsection attaches to the middle subsection along a first hinge line and the right subsection attaches to the middle subsection along a second hinge line such that the two hinge lines are parallel to each other and whereby actuator means move the subsections between a first co-planar position during which solar power may be produced and a second folded position wherein the left and right subsections are rotated upwardly about 90 degrees about the hinge lines and move the foldable strut means downwardly towards the mirror means to transform the system into a more compact configuration.

8. The system of claim 7 wherein the mirror means comprise a plurality of individual flat quadrilateral mirrors arrayed in a Fresnel configuration such that each will shine upon the transducer when the system is in the first position.

9. The mirror means of claim 8 wherein each mirror comprises a backing structure fabricated from a low Z material and beryllium foil stretched across the face of the backing structure facing towards the sun.

* * * * *